(12) United States Patent
Kim

(10) Patent No.: US 6,195,281 B1
(45) Date of Patent: Feb. 27, 2001

(54) APPARATUS FOR GENERATING REFERENCE VOLTAGE IN FERROELECTRIC MEMORY DEVICE

(75) Inventor: Duck-Ju Kim, Ichon (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/605,629

(22) Filed: Jun. 28, 2000

(30) Foreign Application Priority Data

Jun. 28, 1999 (KR) .................................... 99-24976

(51) Int. Cl.$^7$ .................................... G11C 11/22
(52) U.S. Cl. .................. 365/145; 365/189.09; 365/210
(58) Field of Search .................................... 365/145, 203, 365/210, 189.09, 189.11

(56) References Cited

U.S. PATENT DOCUMENTS

| | | |
|---|---|---|
| 5,600,587 | 2/1997 | Koike . |
| 5,615,144 | 3/1997 | Kimura et al. . |
| 5,844,832 | * 12/1998 | Kim ...................................... 365/145 |
| 6,025,225 | 2/2000 | Forbes et al. . |
| 6,026,009 | 2/2000 | Choi et al. . |
| 6,058,049 | * 5/2000 | Kye et al. ........................ 365/189.09 |

FOREIGN PATENT DOCUMENTS

| | | | |
|---|---|---|---|
| 10069790 | 3/1998 | (JP) | ................................ G11C/14/00 |
| 10289590 | 10/1998 | (JP) | ................................ G11C/14/00 |
| 11086566 | 3/1999 | (JP) | ................................ G11C/14/00 |
| 11232881 | 8/1999 | (JP) | ................................ G11C/14/00 |

* cited by examiner

*Primary Examiner*—Vu A. Le
(74) *Attorney, Agent, or Firm*—Jacobson, Price, Holman & Stern, PLLC

(57) ABSTRACT

An apparatus for generating a reference voltage in ferroelectric memory device including a sense amplifier which senses and amplifies a voltage difference between a bit line and a bit line bar, and a plurality of memory cells, each having a ferroelectric capacitor, includes a linear capacitor, in response to a predetermined voltage signal inputted from a cell plate line, for storing a predetermined amount of charges; a first switching device for selectively coupling the linear capacitor to the cell plate line; a second switching device for selectively coupling the linear capacitor to the bit line to thereby provide the predetermined amount of charges as the reference voltage to the bit line.

18 Claims, 5 Drawing Sheets

US 6,195,281 B1

APPARATUS FOR GENERATING REFERENCE VOLTAGE IN FERROELECTRIC MEMORY DEVICE

FIELD OF THE INVENTION

This invention relates to a nonvolatile ferroelectric semiconductor memory device using ferroelectric capacitor memory cell and more particularly, to a reference voltage generator to generate a reference voltage in a read operation of the nonvolatile ferroelectric semiconductor memory device.

DESCRIPTION OF THE PRIOR ART

Generally, a ferroelectric semiconductor memory device, e.g., a nonvolatile ferroelectric random access memory (NVFRAM) includes a plurality of memory cells. Each memory cell includes transistor and at least one ferroelectric capacitor so that the NVFRAM has characteristics of fast access time and small chip size.

FIG. 1 shows a hysteresis loop of a ferroelectric capacitor. That is, a relationship between the polarization charge Q and voltage V applied to the capacitor is shown in the FIG. 1. In the ferroelectric capacitor, even if the voltage difference between two terminals of the ferroelectric capacitor is zero voltage, the charge Q may be one of two values of P1 and P2, to thereby store binary data. Accordingly, based on this characteristics, the ferroelectric capacitor has been used in the nonvolatile memory device.

According to the variation of voltage applied to the both terminals of the ferroelectric capacitor, the stored charges therein vary with the degree of polarization of the ferroelectric material as shown in the hysteresis loop of FIG. 1.

For example, it is assumed that the voltage level of $-V1$ is applied to the two terminals of the ferroelectric capacitor, supposing that a state P1 and a state P2 stand for logic data "1" and "0" respectively. In this case, when the initial charge state of the ferroelectric capacitor is a state P1, the charge state thereof is moved to a state P3 so that the variation of $\Delta Q1$ is induced. When the initial charge state of the ferroelectric capacitor is a state P2, the charge state thereof is moved to a state P3 so that the variation of the charge of $\Delta Q0$ is induced. This varied charge $\Delta Q1$ or $\Delta Q0$ is charge-shared with a charge previously induced on a bit line of a selected memory cell, and the shared charge on the bit line is coupled to a sense amplifier which amplifies and outputs it as a sensed data corresponding thereto. A reference voltage is required to operate the sense amplifier, and has a mean value of combined varied charge, $(\Delta Q1+\Delta Q0)/2$. The reference voltage is generally generated by using a ferroelectric dummy cell circuit.

FIG. 2 shows a circuit diagram of a reference voltage generation circuit which is disclosed in an article by Hiroki Koike et al., "60 ns 1 M bit Nonvolatile Ferroelectric Memory with Non-driven Cell Plate Line Read/Write Scheme", IEEE. *Journal of Solid State Circuits*, Vol.31, No.11, November 1996. As shown, two dummy cell circuits include two ferroelectric capacitors C0 and C1, respectively. The ferroelectric capacitors C0 and C1 store the logic data "0" and "1" respectively. When turning on switching transistors T0 and T1 coupled to a dummy word line (DWL), the varied charges $\Delta Q0$ and $\Delta Q1$ are applied to a reference lines REF1 and REF2 respectively from the ferroelectric capacitors C0 and C1. At this time, When a "high" state signal is applied to an equalizing dummy line EDL, a transistor T2 turns on to thereby add $\Delta Q0$ and $\Delta Q1$ mentioned above, and when each transistor coupled to DTGN or DTGT is turned on, the charge of $(\Delta Q1+\Delta Q0)/2$ is applied to bit lines BL1N, BL2N or BL1T, BL2T.

However, since in the conventional reference voltage circuits, the two dummy cells should store "1" and "0" and at least one switching operation is required in order to provide the reference voltage for each access to a memory cell, the switching transistors constituting of the dummy cell, may be easily fatigued to thereby cause some variation of the reference voltage. Furthermore, since the dummy cells are coupled to the bit line having a multiplicity of memory cells, the dummy cell is read out much more often than the memory cell. Thus, the problem is that lifetime of the device seriously depends upon an operation state of the dummy cell.

Also, another problem is that since the reference voltage generation circuit includes a complex extra circuit for driving the dummy cell which has the ferroelectric capacitor, the further integration of the semiconductor device may be limited.

SUMMARY OF THE INVENTION

It is an object of the present invention to provide an apparatus for generating a reference voltage in a ferroelectric memory device, which is capable of implementing a high integration in the ferroelectric memory device and effectively providing a reference voltage by using a linear capacitor.

It is another object of the present invention to provide an apparatus for generating a reference voltage in a ferroelectric memory device capable of increasing reliability of the ferroelectric memory device.

In accordance with an aspect of the present invention, there is provided an apparatus for generating a reference voltage in ferroelectric memory device including a sense amplifier which senses and amplifies voltage difference between a bit line and the bit line bar, and a plurality of memory cells, each having a ferroelectric capacitor, said apparatus comprising: a linear capacitor, in response to a predetermined voltage signal inputted from a cell plate line, for storing a predetermined amount of charges; a first switching device for selectively coupling the linear capacitor to the cell plate line; and a second switching device for selectively coupling the linear capacitor to the bit line to thereby provide the predetermined amount of charges as the reference voltage to the bit line.

In accordance with another aspect of the present invention, there is provided a ferroelectric memory device having a reference voltage generation circuit for generating a reference voltage, a sense amplifier which senses and amplifies voltage difference between a bit line and a bit line bar, and a plurality of memory cells, each having a ferroelectric capacitor, comprising: a linear capacitor, in response to a predetermined voltage signal inputted from a cell plate line, for storing a predetermined amount of charges; a first switching device for selectively coupling the linear capacitor to the cell plate line; and a second switching device for selectively coupling the linear capacitor to the bit line to provide thereby the predetermined amount of charges as the reference voltage to the bit line.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, preferred embodiments in accordance with the present invention will be described hereinafter in detail referring to the accompanying drawings.

Figure 1:
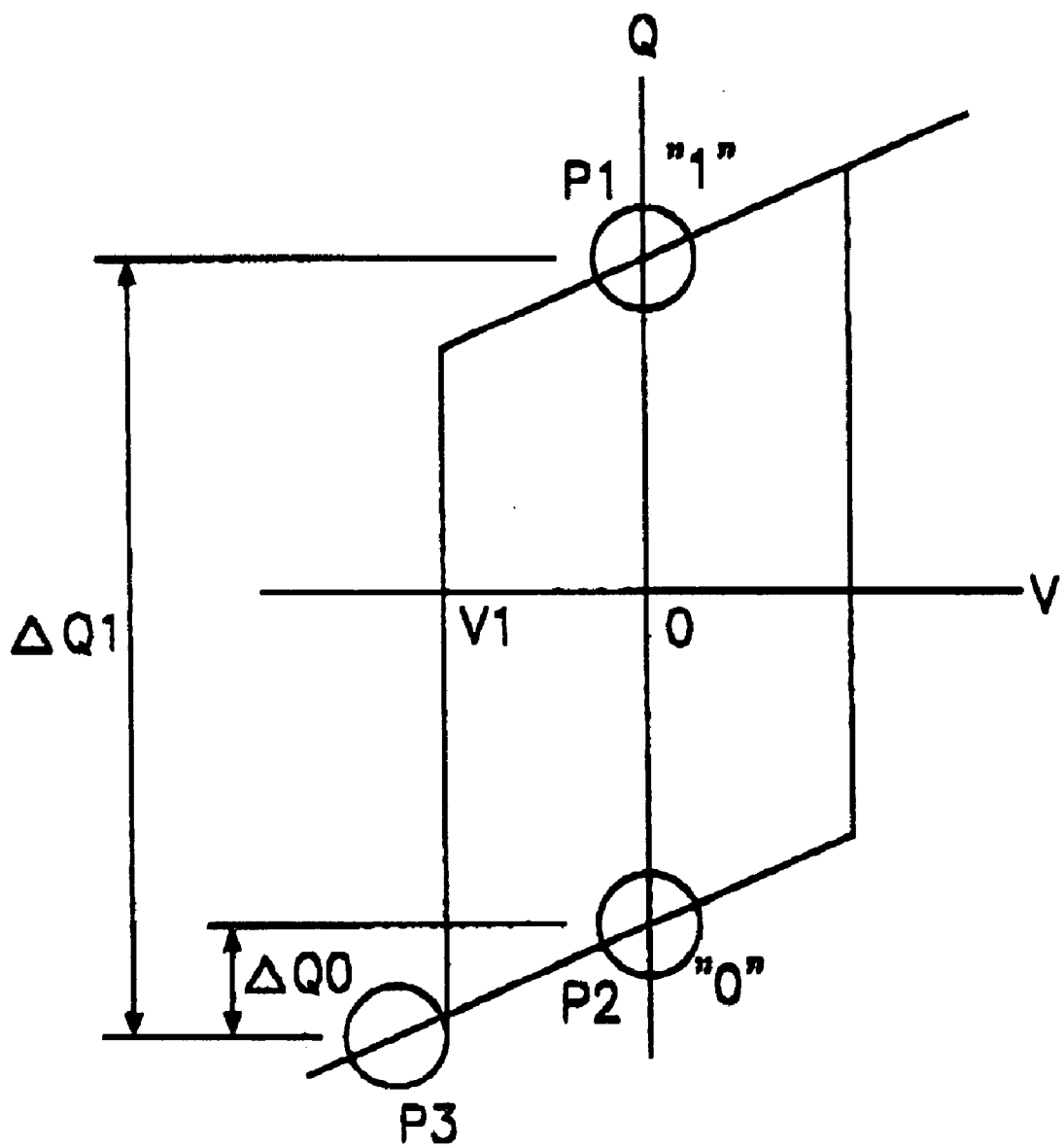
FIG. 1 shows a hysteresis loop of a ferroelectric capacitor.
Figure 2:
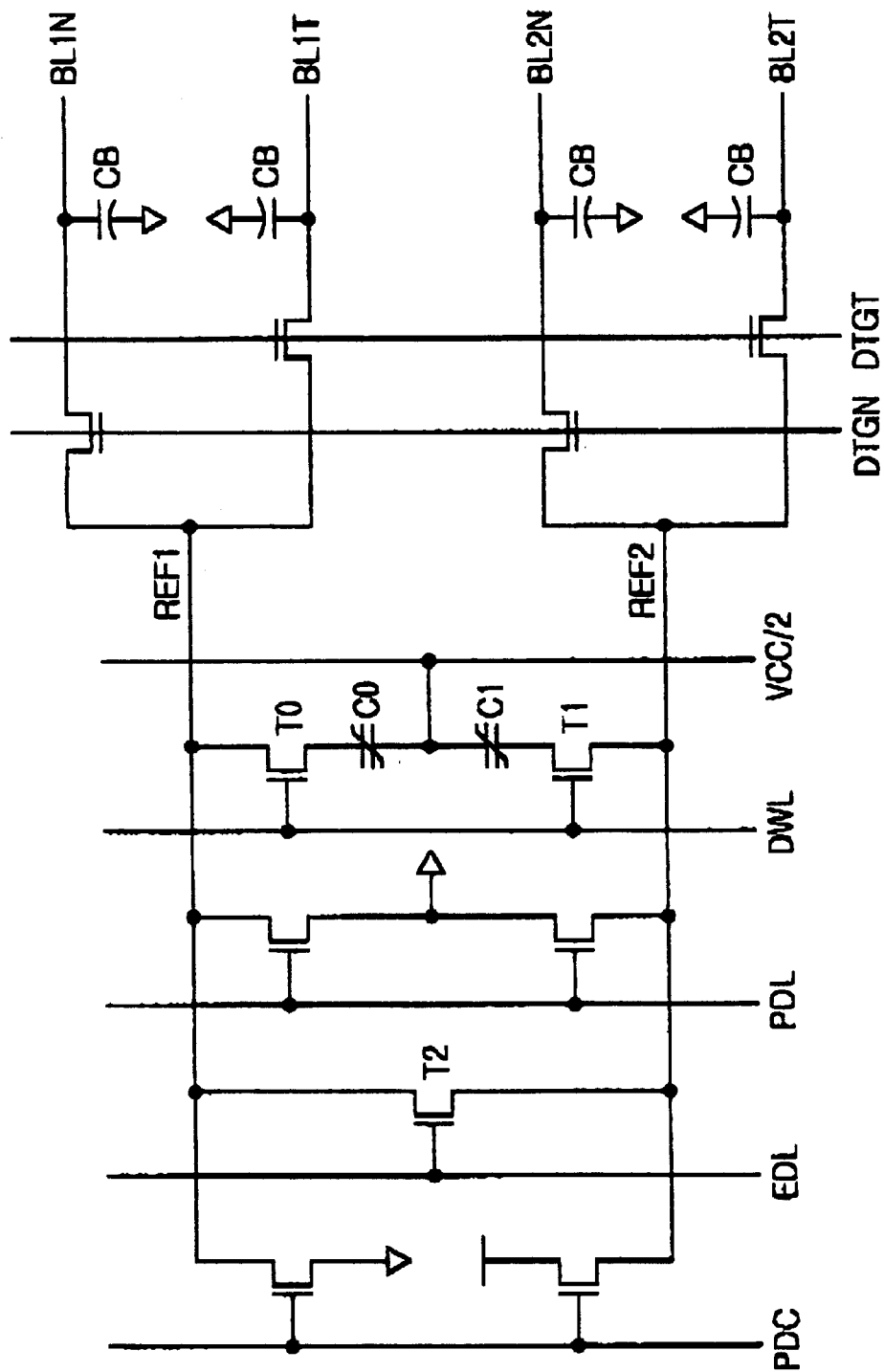
FIG. 2 is a circuit a circuit diagram illustrating a conventional reference voltage generating circuit employed in a conventional ferroelectric memory device.
Figure 3:
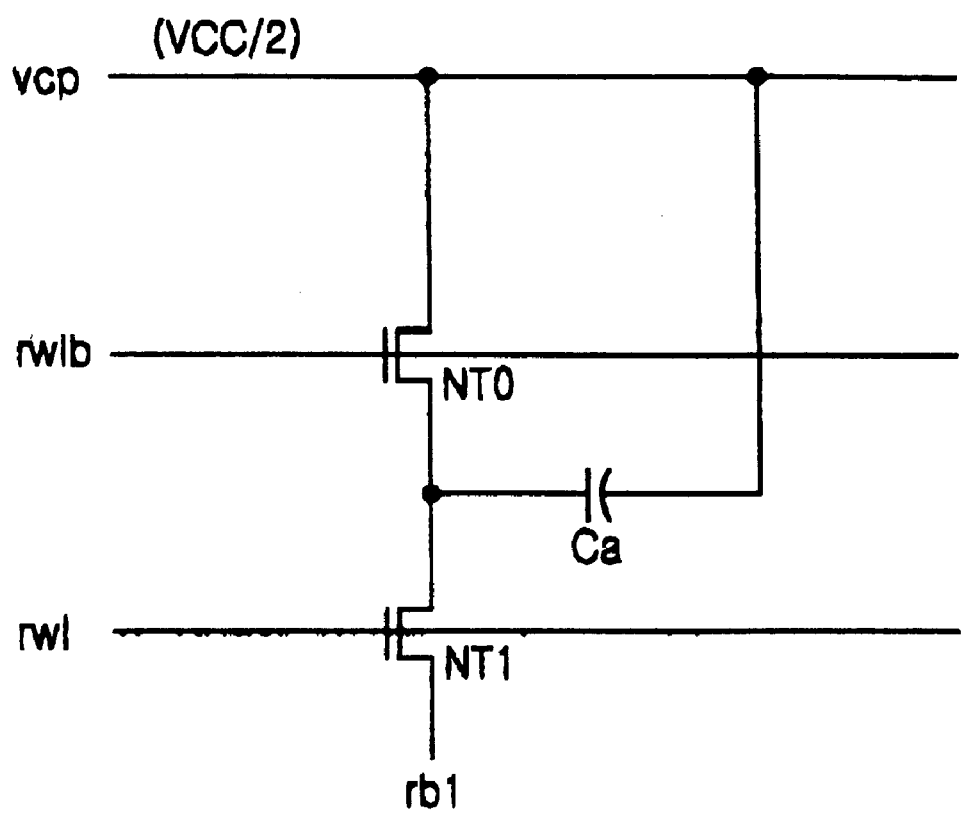
FIG. 3 is a circuit diagram depicting a reference voltage generating circuit in accordance with the present invention.

Referring to FIG. 3, a reference voltage circuit in accordance with the present invention includes two NMOS transistors NT0, NT1 and a linear capacitor. The linear capacitor can be fabricated, as known in the art in order to store a charge corresponding to $(\Delta Q1+\Delta Q0)/2$.

A gate terminal of the NMOS transistor NT1 is connected to a reference word line rwl, and its drain terminal is coupled to a reference bit line rbl. A source terminal of the NT1, a drain terminal of the NT0 and a upper electrode of the linear capacitor Ca are commonly coupled. A gate terminal of the NT0 is connected to a reference word line bar rwlb, and a drain terminal of the NT0 is coupled to a lower electrode of the linear capacitor Ca which is coupled to a cell plate line VCP. In accordance with the present invention, a voltage level of VCC/2 is applied to the cell plate line VCP.

The operation of the apparatus for generating reference voltage in accordance with the present invention will be described hereinafter.

In a standby state, the reference word line rwl is in a low level and the reference word line bar rwlb is in a high level, so that the NT1 is turned off and the NT0 is turned on. A cell plate line voltage of VCC/2 is applied via the cell plate line VCP to the upper and lower electrodes of the linear capacitor Ca which stores a charge corresponding to a reference voltage of $(\Delta Q1+\Delta Q0)/2$.

In an active state, a signal of a high level is inputted to the reference word line rwl and thereby, when the NT1 is turned off, the charge of the linear capacitor Ca is coupled to the reference bit line rbl to thereby generate the reference voltage.

Figure 4:
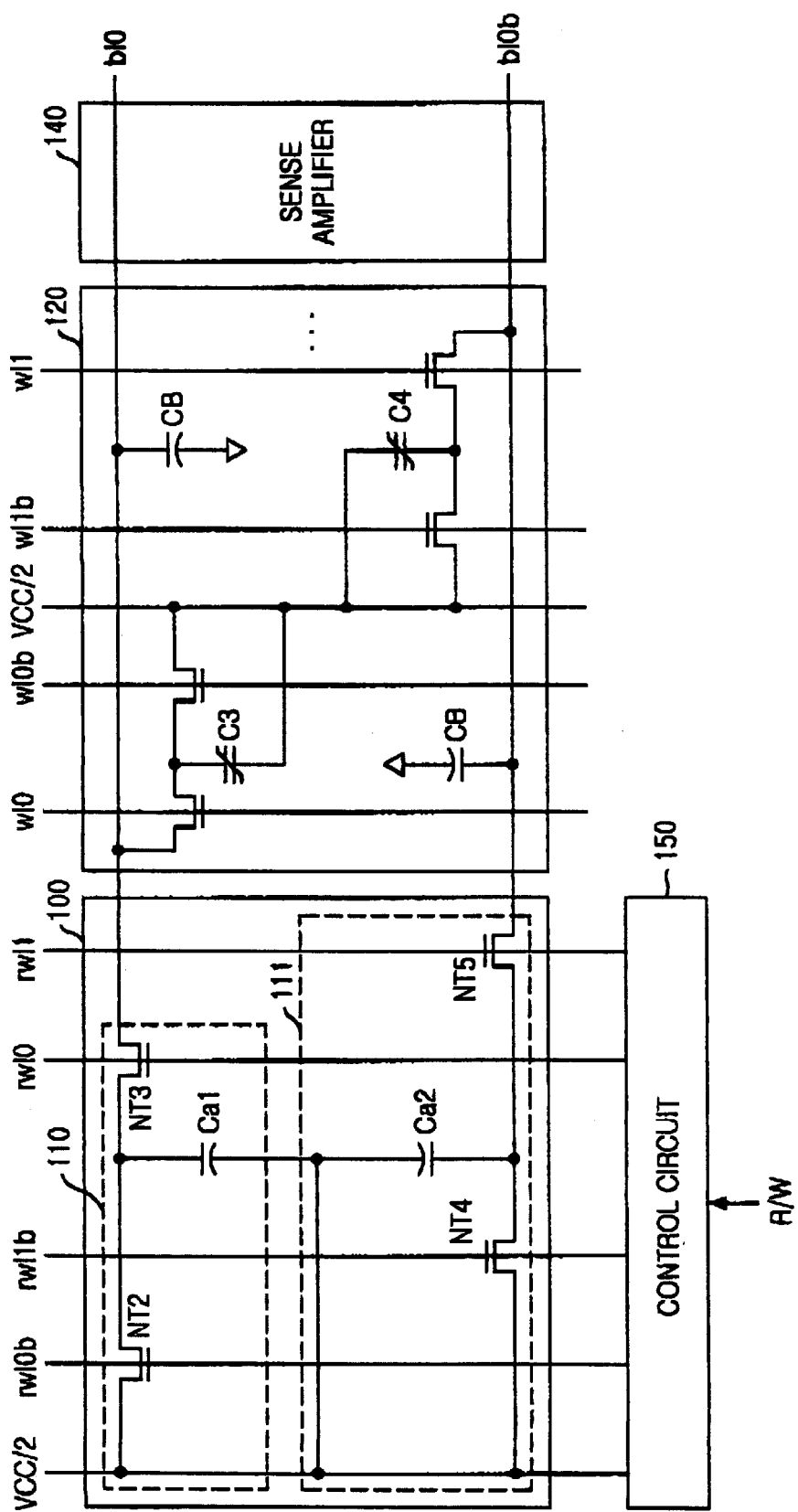
FIG. 4 is a circuit diagram demonstrating a ferroelectric memory device employing the reference voltage generating circuit in accordance with the present invention.

FIG. 4 is a circuit diagram illustrating a ferroelectric memory device employing the reference voltage generating circuit in accordance with the present invention.

The ferroelectric memory device includes the reference voltage generation circuit 100, a memory cell array 120, a sense amplifier 140 which senses and amplifies a voltage difference between a bit line bl0 and a bit line bar bl0*b*, and a control circuit 150 which controls a state of the operation of NMOS transistors NT2, NT3, NT4, NT5 and a cell plate line VCC/2. The reference voltage generation circuit block 100 includes a first reference voltage generation circuit 110 which is coupled to a bit line bl0 and transfers a reference voltage to a bit line bl0, and a second reference voltage generation circuit 111 which is connected to a bit line bar bl0*b* and transfers a reference voltage to a bit line bar bl0*b*. The first reference voltage generation circuit 110 is connected between the cell plate line VCC/2 and the bit line bl0 and in an active state, applies a reference voltage $(\Delta Q1+\Delta Q0)/2$ to the bit line bl0. The first reference voltage generation circuit includes an NMOS transistor NT2, a gate terminal of which is coupled to a first reference word line bar rwl0*b*, an NMOS transistor NT3, a gate terminal of which is coupled to a first reference word line rwl0, and a linear capacitor Ca1, an upper electrode and a lower electrode of which are connected to a common source-drain node of the NMOS transistors NT2 and NT3, and a cell plate line VCC/2, respectively. The second reference voltage generation circuit 111 is connected between the cell plate line VCC/2 and the bit line bar bl0*b*, and, in an active state, applies the reference voltage $(\Delta Q1+\Delta Q0)/2$ to the bit line bar bl0*b*. The second reference voltage generation circuit includes an NMOS transistor NT4, a gate terminal of which is coupled to a second reference word line bar rwl1*b*, an NMOS transistor NT5, a gate terminal of which is coupled to a second reference word line rwl1, and a linear capacitor Ca2 an upper electrode and a lower electrode of which are connected to a common source-drain node of the NMOS transistors NT4 and NT5, and a cell plate line VCC/2, respectively.

The memory cell array 120 includes a plurality of memory cells, each memory cell having a ferroelectric capacitor. The configuration and operation of the memory cell array is well known in the art and for the shake of convenience, detailed description is omitted.

Figure 5:
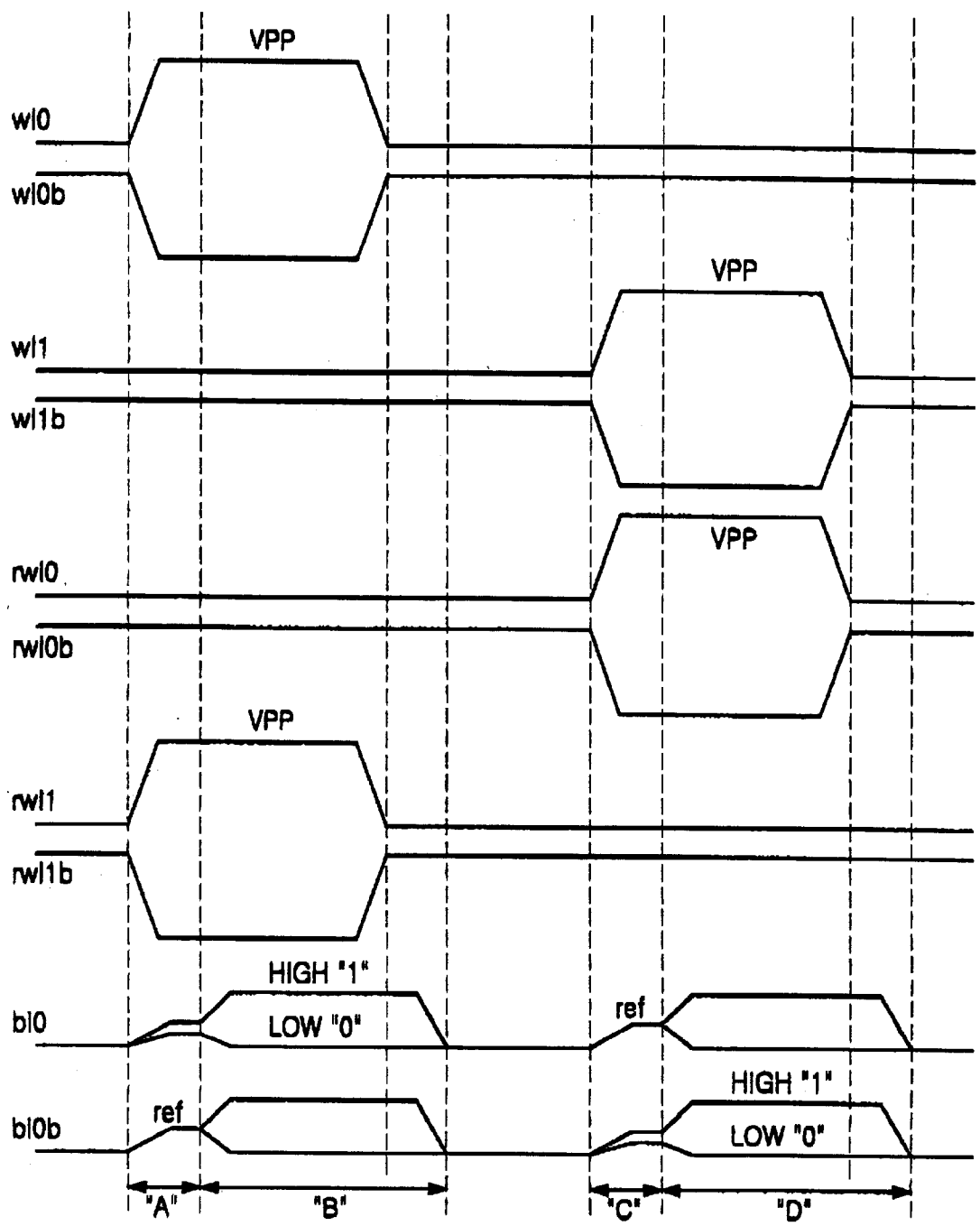
FIG. 5 is a timing chart disclosing the operation of the ferroelectric memory device shown in FIG. 4.

FIG. 5 is a timing chart depicting the operation of the ferroelectric memory device shown in the FIG. 4.

In a duration "A", when a first word line signal wl0 is enabled to a "high" level VPP, according to data stored in the ferroelectric capacitor C3, a charge of "Q0" or "Q1" is loaded into the bit line bl0. And when also the second reference word line rwl1 is enabled to a "high" level VPP, a charge of $(\Delta Q1+\Delta Q0)$ stored in the linear capacitor Ca2 in the second reference voltage generation circuit 111, is loaded into the bit line bar bl0*b*.

In a duration "B", when the sense amplifier 140 is enabled, the sense amplifier reads out data "1" or "0" stored in the ferroelectric capacitor C3 by sensing and amplifying the potential difference between the bit line bl0 into which a charge of "Q1" or "Q0" is loaded, and the bit line bar bl0*b*, into which a charge of "$(\Delta Q1+\Delta Q0)/2$" is loaded from the second reference voltage generation circuit 111.

Also, in a duration "C", when the second word line signal wl1 is enabled to a "high" level VPP, according to data stored in a ferroelectric capacitor C4, a charge of "Q0" or "Q1" is loaded into the bit line bar bl0*b*. And, when also the first reference word line rwl0 is enabled to a "high" level, a charge of "$(\Delta Q1+\Delta Q0)/2$" stored in the linear capacitor Ca1 in the first reference voltage generation circuit 110, is loaded into the bit line bl0.

In a duration "D", when the sense amplifier 140 is enabled, the sense amplifier reads out data "1" or "0" stored in the ferroelectric capacitor C4 by sensing and amplifying the potential difference between the bit line bar bl0*b* into which a charge of "Q1" or "Q0" is loaded, and the bit line bl0, into which a charge of "$(\Delta Q1+\Delta Q0)/2$" is loaded from the first reference voltage generation circuit 110.

As can be seen from above, the reference voltage generation circuit of the present invention supplies a stable reference voltage because degradation due to a ferroelectric capacitor is removed by employing a linear capacitor which stores a charge corresponding to a reference voltage. Accordingly, reliability of the ferroelectric memory device can be increased.

Also, the reference voltage generation circuit does not employ a complex extra circuit to drive ferroelectric capacitors used in the art, the integration of the ferroelectric memory device can be effectively increased.

Although the preferred embodiments of the invention have been disclosed for illustrative purpose, those skilled in the art will appreciate that various modifications, additions, and substitutions are possible, without departing from the scope and sprit of the invention as disclosed in the accompanying claims.

What is claimed is:

1. An apparatus for generating a reference voltage in ferroelectric memory device including a sense amplifier which senses and amplifies a voltage difference between a bit line and a bit line bar, and a plurality of memory cells, each having a ferroelectric capacitor, said apparatus comprising:

a linear capacitor, in response to a predetermined voltage signal inputted from a cell plate line, for storing a predetermined amount of charges;

a first switching device for selectively coupling the linear capacitor to the cell plate line; and a second switching device for selectively coupling the linear capacitor to the bit line to thereby provide the predetermined amount of charges as the reference voltage to the bit line.

2. The apparatus as recited in claim 1, wherein the predetermined amount of charges is determined by a mean value of a first charge plus a second charge to be outputted from the ferroelectric capacitor.

3. The apparatus as recited in claim 2, wherein the predetermined voltage signal is ½ of a source voltage.

4. The apparatus as recited in claim 3, wherein the linear capacitor includes:

a first terminal coupled to the cell plate line; and a second terminal coupled via the first switching device to the cell plate line and via the second switching device to the bit line.

5. The apparatus as recited in claim 1, further comprising a control device, in response to a read/write control signal, for controlling the second switching device in order to couple the linear capacitor to the bit line to thereby provide the predetermined amount of charges as the reference voltage to the bit line in a read operation.

6. The apparatus as recited in claim 5, wherein the second switching device is an MOS transistor which is connected between the linear capacitor and the bit line, and a gate terminal of which is coupled to the control device.

7. The apparatus as recited in claim 6, wherein the first switching device is an MOS transistor which is connected between the cell plate line and the linear capacitor, a gate terminal of which is connected to the control device.

8. A ferroelectric memory device having a reference voltage generation circuit for generating a reference voltage, a sense amplifier which senses and amplifies a voltage difference between a bit line and a bit line bar, and a plurality of memory cells, each having a ferroelectric capacitor, comprising:

a linear capacitor, in response to a predetermined voltage signal inputted from a cell plate line, for storing a predetermined amount of charges;

a first switching device for selectively coupling the linear capacitor to the cell plate line; and a second switching device for selectively coupling the linear capacitor to the bit line to thereby provide the predetermined amount charge as the reference voltage to the bit line.

9. The ferroelectric memory device as recited in claim 8, further comprising:

a second linear capacitor, in response to the predetermined voltage signal inputted from a cell plate line, for storing the predetermined amount of charges;

a third switching device for selectively coupling the linear capacitor to the cell plate line; and a fourth switching device for selectively coupling the linear capacitor to the bit line bar to thereby provide the predetermined amount charge as the reference voltage to the bit line.

10. The ferroelectric memory device as recited in claim 9, wherein the predetermined amount of charges is determined by a mean value of a first charge plus a second charge to be outputted from the ferroelectric capacitor.

11. The ferroelectric memory device as recited in claim 10, wherein the predetermined voltage signal is ½ of a source voltage.

12. The ferroelectric memory device as recited in claim 11, wherein the first linear capacitor includes:

a first terminal coupled to the cell plate line; and a second terminal coupled via the first switching device to the cell plate line and via the second switching device to the bit line.

13. The ferroelectric memory device as recited in claim 12, wherein the second linear capacitor includes:

a first terminal coupled to the cell plate line; and a second terminal coupled via the third switching device to the cell plate line and via the fourth switching device to the bit line.

14. The ferroelectric memory device as recited in claim 13, further comprising a control device, in response to a read/write control signal, for controlling the second switching device and the fourth switching device in order to selectively couple the first linear capacitor and second linear capacitor to the bit line and the bit line bar to provide thereby the predetermined amount of charges as the reference voltage to the bit line in a read operation.

15. The ferroelectric memory device as recited in claim 14, wherein the second switching device is an MOS transistor which is connected between the linear capacitor and the bit line, and a gate terminal of which is coupled to the control device.

16. The ferroelectric memory device as recited in claim 15, wherein the fourth switching device is an MOS transistor which is connected between the linear capacitor and the bit line bar, and a gate terminal of which is coupled to the control device.

17. The ferroelectric memory device as recited in claim 16, wherein the first switching device is a MOS transistor which is connected between the cell plate line and the linear capacitor, and a gate terminal of which is connected to the control device.

18. The ferroelectric memory device as recited in claim 16, wherein the third switching device is a MOS transistor which is connected between the cell plate line and the linear capacitor, and a gate terminal of which is connected to the control device.

* * * * *